// United States Patent [15] 3,701,050
Mizuno et al. [45] Oct. 24, 1972

[54] SOLID STATE MICROWAVE OSCILLATING DEVICE

[72] Inventors: Hiroyuki Mizuno, Toyonaka; Shinichi Nakashima, Suita; Yukio Miyai, Osaka, all of Japan

[73] Assignee: Matsushita Electronics Corporation, Osaka, Japan

[22] Filed: April 21, 1971

[21] Appl. No.: 135,867

Related U.S. Application Data

[63] Continuation-in-part of Ser. No. 599,524, Dec. 6, 1966.

[52] U.S. Cl. .............331/107 R, 331/96, 317/234 T, 317/234 VA

[51] Int. Cl. ..............................................H03b 7/06

[58] Field of Search.....331/107, 108, 96; 317/234 T, 317/234 VA

[56] References Cited

UNITED STATES PATENTS 2,914,665 11/1959 Lindner.....................331/107

OTHER PUBLICATIONS

Proc. IRE, " The Potential of Semiconductor Diodes in Highfrequency Communications" A. Uhlir, Jr. June 1958, Page 1099- 1102

*Primary Examiner*—John Kominski
*Attorney*—Stevens, Davis, Miller & Mosher

[57] ABSTRACT

The present invention provides a device for producing microwave oscillations which generally comprises a solid state oscillating element and a cavity resonator, said element comprising a semiconductor substrate with a metal layer thereon and a rectifying junction formed therebetween. An electric potential is impressed on the depletion layer of the rectifying junction in the backward direction, thus producing microwave oscillations.

3 Claims, 3 Drawing Figures

PATENTED OCT 24 1972 3,701,050

H. MIZUNO,
S. NAKASHIMA,
AND
Y. MIYAI INVENTORS

BY Stevens, Davis, Miller & Mosher
ATTORNEY

SOLID STATE MICROWAVE OSCILLATING DEVICE

CROSS-REFERENCES TO RELATED APPLICATIONS

This is a continuation-in-part application of the copending U.S. application Ser. No. 599524 filed on Dec. 6, 1966.

BACKGROUND OF THE INVENTION

1. Field of the Invention

The present invention relates to a solid state device capable of producing microwave oscillations.

2. Description of the Prior Art

Heretofore, it has been known that microwave oscillations are produced in the range of 5 giga-cycle (Gc) [$\times 10^9$ cycles] to 80 giga-cycle (Gc), when a pulse or DC voltage field is impressed toward the higher resistance direction (backward direction) on a single crystal pellet ranging from about 10 microns to over 100 microns thick of gallium arsenide (GaAs) or a pellet having a p-n junction formed by the diffusion method on a silicon single crystal. Such a reference can be found on pages 437 and 438 of "Industrial Electronics" for September 1965.

SUMMARY OF THE INVENTION

The present inventors discovered that an oscillation is produced by impressing a voltage, in the backward direction, on the rectifying junction between a metal and a semiconductor base. The present invention pertains to a microwave oscillating device based on this discovery.

It is therefore an object of the present invention to provide a new and useful solid state device for producing microwave oscillations.

The means for accomplishing the foregoing objects and other advantages, which will be apparent to those skilled in the art, are set forth in the following specification and claims and are illustrated in the accompanying drawings dealing with a basic embodiment of the present invention.

DESCRIPTION OF THE PREFERRED EMBODIMENTS

Figure 1:
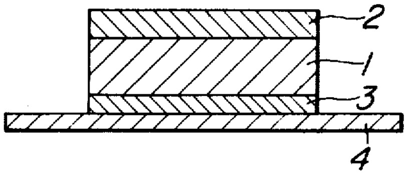
FIG. 1 shows a schematic cross section of a microwave solid state oscillating element embodying the present invention.

In FIG. 1 an n-type or p-type germanium semiconductor substrate 1 is used as the base. A metal 2, e.g., gold, and a metal 3, which is suitable to make an ohmic contact with germanium, e.g., tin-solder in the case of an n-type germanium, and indium in the case of a p-type germanium, are formed on the base. A heat radiator 4, made of copper, etc., completes the semiconductor.

The germanium substrate 1, used as the base, preferably should contain impurities of about $1 \times$ $10^{16}/cm^3$ to $1 \times 10^{18}/cm^3$ for the sake of efficiency. The semiconductor substrate 1 need not be only germanium since silicon and the like will also do. In either instance, the depletion layer formed at the rectifying junction between the metal 2 and the substrate 1 should be as narrow as possible to avoid thermal breakdown of the device. A higher impurity concentration of the semiconductor substrate 1 is preferable in this regard. However, if the concentration is too high, the depletion layer becomes too narrow and causes an ohmic junction condition in which electrons tunnel their way through depletion layer. This is an undesirable condition.

Because the amount of impurity in the semiconductor substrate controls the width of the depletion layer, as described above, choice of the optimum value for impurities is necessary. As described above, an impurity content of $1 \times 10^{16}/cm^3$ to $1 \times 10^{18}/cm^3$ for germanium was established experimentally from such a standpoint.

Any known method may be used for contacting the metal 2 to the base semiconductor substrate 1 as long as the contacts are made on physically clean surfaces. For example, high purity gold may be evaporated and then deposited on a clean surface of the semiconductor.

The electrode metal, represented by 3 in FIG. 1, is next attached to the device consisting of the metal, depletion layer, and semiconductor. If this electrode 3 dissipates heat from the device well, the result will be good. For example, if the surface opposite to the ohmic junction, on the germanium side of the electrode 3, is soldered on a copper substrate, the speed of heat dissipation will be accelerated, and breakdown of the device is effectively prevented. The inventive device, when finished in this way, may be used either singly or in combination when a number of them can be mounted as a unit.

Figure 2:
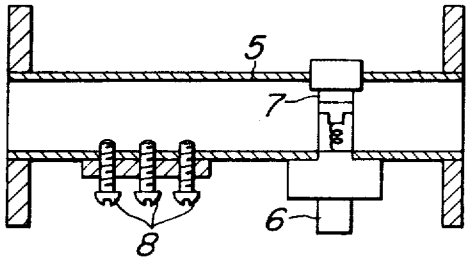
FIG. 2 illustrates an example of the method of mounting the inventive device in a cavity resonator.

FIG. 2 exemplifies a device for producing microwave oscillations in which the invention or inventive unit is mounted within a cavity resonator. The cavity resonator should be of an appropriate frequency band to correspond to the oscillation frequency. FIG. 2 shows a wave guide 5, a connector electrode 6, the inventive semiconductor device 7, and a tuning probe 8 for matching impedance. There are many methods for mounting the semiconductor device. In one acceptable method, the device is inserted into the cavity resonator and held by an appropriate spring bias on the electrodes.

A DC voltage or a pulse voltage is impressed on the semiconductor device from the electrode in the backward direction from that of the junction of the semiconductor device. When this voltage exceeds a critical value at which the backward current abruptly increases, a microwave oscillation is produced. The frequency, stability, and magnitude of the microwave produced vary depending on the thickness and structure of the semiconductor device. In order to obtain a stable microwave, the thickness of the semiconductor device should be uniform throughout.

If a semiconductor with high specific resistance, that is, with a low impurity content, is used as the base, the impressed voltage necessary to produce an oscillation becomes great, and the resulting oscillation is unstable.

Making the thickness of the base semiconductor 1 thinner than 1 mm is one effective method for obtaining uniform and stable oscillation. However, if the semiconductor base is germanium and has a shape conductive to heat dissipation, the oscillation will be stable even if the device is as thick as several hundred to several thousand microns.

The present invention will next be described with reference to a specific embodiment. A microwave oscillation of about 10 giga-cycle was produced when about 15 V was impressed, in the backward direction to the rectifying junction, on a semiconductor element of 0.01 $mm^2$ in area with gold deposited, from evaporation to the depth of 1 micron, on an n-type germanium pellet 500 microns thick and containing antimony in the amount of $5 \times 10^{16}/cm^3$. In order to obtain stable oscillation, the rising slope of the breakdown current, in the backward direction of the aforementioned semiconductor device, is preferably sharp. Diodes giving the characteristic of an obtuse rising slope often breakdown before a stable oscillation is maintained.

Figure 3:
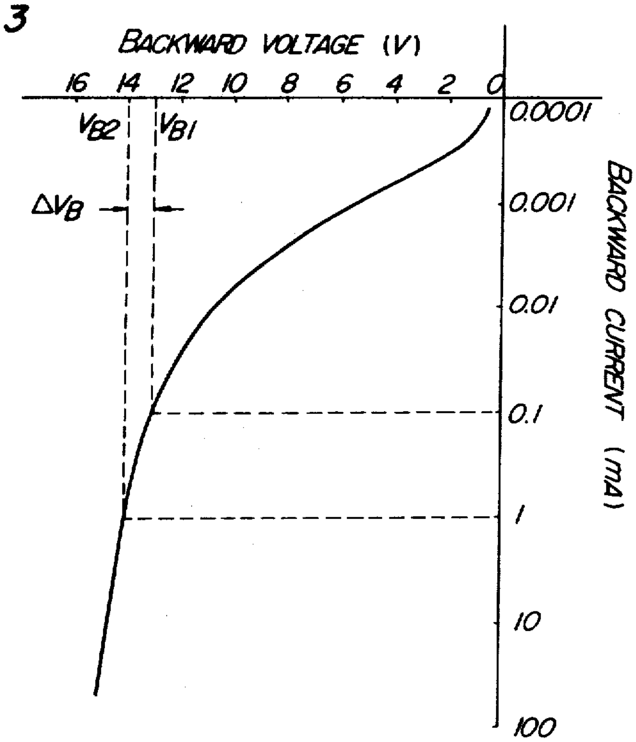
FIG. 3 is a diagram showing the backward characteristics of an oscillating element used in the present invention.

It has been found by the applicants' s experiment with the above embodiment that a microwave oscillation of good repeatability is obtained, if the backward breakdown characteristic of the semiconductor element satisfies a certain condition. FIG. 3 shows such a characteristic, that is, a curve representing the relation between the backward voltage and the backward current. If the curve is sufficiently steep at the point where an avalanche current starts, that is, at the voltage where the breakdown occurs, the required oscillation is obtained. The above-mentioned condition is expressed by the following formula:

$$\frac{\Delta V_B}{V_{B2}}=\frac{V_{B2}-V_{B1}}{V_{B2}}\leq 0.1$$

where $V_{B1}$ is the backward voltage for the backward current of 100 micro-A (that is, current density of 1 $A/cm^2$) and $V_{B2}$ is the similar voltage for the backward current of 1000 micro-A (that is, current density of 10 $A/cm^2$).

Further it was verified that in order to obtain a stable continuous wave oscillation, the backward current density, that is, the density of avalanche current must be fairly large. According to the applicants' experiment, the current density was required to be not less than 25 $A/cm^2$ which corresponds to an avalanche current of 2.5 mA in the present embodiment.

The semiconductor device of this invention is characterized by a simple construction of the rectifying junction between the metal and the semiconductor. This semiconductor device may be produced in large quantity at low cost. Taking as an example the evaporation method described above, semiconductor devices of the same quality but in arbitrary shapes may be manufactured in quantity and at reduced costs by properly choosing the mask or the photo-mask for use in the evaporation. Moreover, very small semiconductor devices may be made available by improving the precision of the mask resulting in obtaining a contact area of about several microns. As described above, reduction in size of the semiconductor device makes dissipation of the Joule's heat easier, due to the input power loss, and therefore is effective for preventing a temperature rise, assuring stable operation of the semiconductor device in a high frequency region.

As described in detail above, the microwave oscillating solid state semiconductor device of this invention possesses efficient performance and improves oscillating devices for communication and other applications because it is available in small size as compared with the usual microwave oscillating electron tubes or oscillating semiconductor devices. Moreover, it requires no complex accessories and employs no special materials.

The invention may be embodied in other specific forms without departing from the spirit or essential characteristics thereof. The present embodiment is therefore to be considered in all respects as illustrative and not restrictive, the scope of the invention being indicated by the appended claims rather than the foregoing description, and all changes which come within the meaning and range of equivalency of the claims are therefore to be embraced therein.

What we claim is:

1. A solid state microwave oscillating device comprising an oscillating element and a cavity resonator electromagnetically coupled with said oscillating element, said element comprising a semiconductor substrate containing an impurity in the concentration of $1 \times 10^{16}$ to $1 \times 10^{18}$ atoms/$cm^3$ and a metal layer provided on said substrate, a rectifying junction being formed between said substrate and said metal layer, said junction having such a backward breakdown characteristic as to be expressed by formula $$\frac{V_{B2}-V_{B1}}{V_{B2}}\leq 0.1$$

where $V_{B1}$ is the backward voltage at a corresponding to the backward current density of 1 $A/cm^2$ and $V_{B2}$ is the backward voltage at a point corresponding to the backward current density of 10 $A/cm^2$, said device further comprising means for impressing a backward voltage on said junction so as to yield a backward current in the current density not less than 25 $A/cm^2$.

2. A solid state microwave oscillating device according to claim 1 in which said substrate is germanium.

3. A solid state microwave oscillating device according to claim 1 wherein said substrate is no greater than 1 mm in thickness.

* * * * *

UNITED STATES PATENT OFFICE

CERTIFICATE OF CORRECTION

Patent No. 3,701,050 Dated October 24, 1972

Inventor(s) Hiroyuki MIZUNO, Shinichi NAKASHIMA and Yukio MIYAI

It is certified that error appears in the above-identified patent and that said Letters Patent are hereby corrected as shown below:

Please insert the following reference to the Japanese Application missing from the original Letters Patent:

Japanese Application No. 79059 filed December 20, 1965.

Signed and sealed this 29th day of May 1973.

(SEAL)
Attest:

EDWARD M.FLETCHER,JR.
Attesting Officer

ROBERT GOTTSCHALK
Commissioner of Patents

FORM PO-1050 (10-69)